(12) United States Patent
Asano

(10) Patent No.: US 8,465,661 B2
(45) Date of Patent: Jun. 18, 2013

(54) METHOD OF PROCESSING GRAPHENE SHEET MATERIAL AND METHOD OF MANUFACTURING ELECTRONIC DEVICE

(75) Inventor: Koji Asano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/228,785

(22) Filed: Sep. 9, 2011

(65) Prior Publication Data

US 2011/0315655 A1    Dec. 29, 2011

Related U.S. Application Data

(63) Continuation of application No. PCT/JP2009/057891, filed on Apr. 21, 2009.

(51) Int. Cl.
  *B44C 1/22* (2006.01)
  *C23F 1/00* (2006.01)

(52) U.S. Cl.
  USPC ............... 216/81; 216/13; 977/888; 977/755

(58) Field of Classification Search
  USPC ................................ 216/13, 81; 977/888, 755
  See application file for complete search history.

(56) References Cited

FOREIGN PATENT DOCUMENTS

| JP | 2007-098357 A | 4/2007 |
| JP | 2007-169112 A | 7/2007 |
| WO | 2008/026304 A1 | 3/2008 |

OTHER PUBLICATIONS

A. C. Ferrari et al.; "Raman Spectrum of Graphene and Graphene Layers"; Physical Review Letters, vol. 97, (2006), pp. 187401-1 thru 187401-4.
K. Hattori et al. "Electrical properties of graphene oxide reduced by UV irradiation"; Proceeding of the 56th meeting of Japan society of applied physics and related societies, 2009, Ia-TA-6, p. 515.
K. S. Novoselov et al.; "Electric Field Effect in Atomically Thin Carbon Films"; Science , Oct. 22, 2004, vol. 306, No. 5696, pp. 557-760.
Yuanbo Zhang et al.; "Experimental observation of the quantum Hall effect and Berry's phase in graphene"; Nature, Nov. 10, 2005; vol. 438, pp. 201-204.
International Search Report of PCT/JP2009/057891, date of mailing Jul. 21, 2009.

*Primary Examiner* — Roberts Culbert
(74) *Attorney, Agent, or Firm* — Westerman, Hattori, Daniels & Adrian, LLP

(57) ABSTRACT

A method of processing a graphene sheet material includes irradiating UV ray to a graphene sheet material in an atmosphere containing a first substance to inactivate an edge of the graphene sheet material by substituting an end group connected to the edge of the graphene sheet material with more stable functional group generated from the first substance, and irradiating UV ray to a surface of the graphene sheet material in an atmosphere containing a second substance containing oxygen to activate the second substance, and oxidize and remove a graphene sheet contained in the graphene sheet material sequentially from a surface side.

18 Claims, 5 Drawing Sheets

METHOD OF PROCESSING GRAPHENE SHEET MATERIAL AND METHOD OF MANUFACTURING ELECTRONIC DEVICE

CROSS REFERENCE TO RELATED APPLICATIONS

This application is a Continuation of International Application No. PCT/JP2009/057891, with an international filing date of Apr. 21, 2009, which designating the United States of America, the entire contents of which are incorporated herein by reference.

FIELD

The embodiments discussed herein are related to a method of processing a graphene sheet material which reforms a surface of a graphene sheet material, and a method of manufacturing an electronic device including a graphene sheet material.

BACKGROUND

Recently, in semiconductor integrated circuit devices including semiconductor devices, printed circuit boards, etc., the use of the so-called graphene sheet material as an electronic member having the properties of conductor is being studied.

The graphene sheet material includes a thin film graphene of 1 to 10 horizontal layers of graphite (graphen sheets), and the general materials driven from such thin film graphene, such as the chemically modified thin film graphene, etc. The graphene sheet material is superior in chemical stability while having various attractive characteristics, such as peculiar physical and electric properties, etc. and is noted as a constituent material of semiconductor devices.

Specifically, applications of the graphene sheet material to the interconnections and via structural members of semiconductor devices, and parts of semiconductor elements, e.g., graphene channel transistors and a graphene interconnections of LSI, etc. are being studied.

Conventionally, in forming the graphene sheet material, the process of transferring graphene sheets from a graphite bulk with an adhesive member, such as adhesive tape or others, the vacuum film-forming process, such as CVD method or others, etc. have been used.

The following are examples of related: Japanese Laid-open Patent Publication No. 2007-098357; Y. B. Mang et al., Nature, Vol. 438, p. 201 (2005); K. S. Novoselov et al., Science, Vol. 306, p. 666 (2004); and A. C. Ferrari et al., Physical Review Letters, Vol. 97, p. 187401 (2006).

To apply the graphene sheet material to downsized devices, such as semiconductor elements, etc., it is necessary that the graphene sheet material including a required layer number of graphene sheets are formed. However, the above-described conventional method of forming graphene sheet material cannot control a layer number of the graphene sheets.

SUMMARY

According to one aspect of an embodiment, there is provided a method of processing a graphene sheet material including irradiating UV ray to a graphene sheet material in a first atmosphere containing a first substance to activate the first substance and inactivate an edge of the graphene sheet material by the activated first substance.

According to another aspect of an embodiment, there is provided a method of manufacturing an electronic device including irradiating UV ray to a graphene sheet material in a first atmosphere containing a first substance to activate the first substance and inactivate an edge of the graphene sheet material by the activated first substance.

The object and advantages of the embodiment will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENTS

Figure 1:
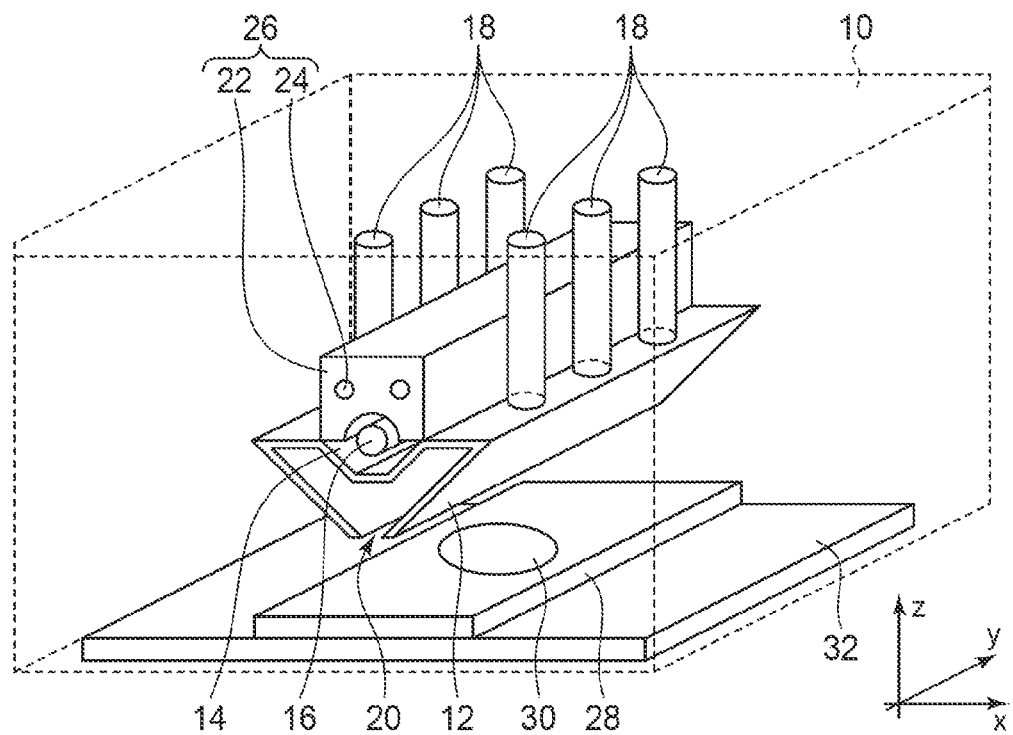
FIG. 1 is a diagrammatic perspective view illustrating a processing apparatus of a graphene sheet material according to an embodiment.

A method of processing a graphene sheet material according to an embodiment will be described with reference to FIGS. 1 to 5D.

The method of processing the graphene sheet material according to the present embodiment irradiates vacuum ultraviolet ray (VUV) and supplies a substance which can reform the carbon nanomaterial in combination with the VUV, whereby the graphene sheet material is processed.

The substance which can reform the graphene sheet material in combination with VUV includes a substance which can inactivate an edge of the graphene sheet material in combination with VUV and a substance which can etch the surface of the graphene sheet material in combination with VUV. In the following description, the substance which can inactivate the edge of the graphene sheet material in combination with VUV will be expressed in cases by "the first specific substance". In the following description, the substance which can etch the surface of the graphene sheet material in combination with VUV will be expressed in cases by "the second specific substance". Often "the first specific substance" and "the second specific substance" are collectively expressed simply by "the specific substance". In this specification, the "edge" means a terminal end part of a graphene skeleton and includes not only the outer peripheral edge of the graphene sheet material but also defective parts, etc., such as concave surface parts, of the graphene sheet material.

The edge of the graphene sheet material can be inactivated by irradiating VUV to the graphene sheet material and supplying the first specific substance. Then, to the graphene sheet material having the edge inactivated, VUV is irradiated, and the second specific substance is supplied, whereby the graphene sheet material can be uniformly etched from the surface with suppressing the etching from the edge. The edge of the graphene sheet material is inactivated, which makes it unnecessary to make the etching with the edge protected by a hard mask or others, and the process of manufacturing the graphene sheet material having the layer number controlled can be simplified.

The edge of the graphene sheet material will be inactivated by the first specific substance being activated by the VUV and generating a chemically active species, such as radicals, etc., and the chemical species acting on the edge of the graphene sheet material.

The details of its mechanism have not yet been cleared but will be as follows. That is, the mechanism is that the bonds of the first specific substance floating near the graphene sheet material are cleaved by the irradiated VUV, and an active chemical species, such as alkyl radicals, etc., is generated; and these radicals, which are unstable and highly reactive, substitute the end groups of relatively highly reactive defective parts (mainly the bonds of the edge) on the graphene sheet material near the radicals and form covalent bonds. Otherwise, the mechanism is that the chemically active species does not make the direct chemical bonding with the graphene sheet material, but the chemically active species, such as radicals, etc., reacts with each other and re-bonds to form products of higher boiling point (low volatility), and the products are adsorbed to the edge of the graphene sheet material.

In addition to them is considered the mechanism that the first specific substance or a part of it adsorbs to the surface of the graphene sheet material and acts on the surface of the graphene sheet material without the medium of the chemically active species, such as the radicals, etc. generated by the VUV. In the above-described actions, the chemical bonding is considered to be probably major, but the physical adsorption, etc. may participate. However, these mechanisms and the action modes are not related with the essence of the method of processing the graphene sheet material according to the present embodiment.

Whether it is the first specific substance can be confirmed by the edge of the graphene sheet material having been reformed in a sense after the VUV has been irradiated. When the edge of the graphene sheet material has been reformed by contacting the first specific substance to the graphene sheet material without the use of the VUV, whether it is the first specific substance can be confirmed by the edge being reformed by larger degrees.

The reformation of the edge of the graphene sheet material can be confirmed specifically by a specific group (e.g., alkyl group) introduced onto the edge of the graphene sheet material, changes of etching characteristics under specific conditions, or others. Such reformation can be confirmed by the edge of the graphene sheet material having been reformed in a sense or the edge of the graphene sheet material having been more reformed than without irradiating the VUV.

Otherwise, a substance which can generate a chemically active species, such as radicals, etc., by VUV falls into the first specific substance in many cases, and a substance which can generate a chemically active species, such as radicals, etc., by VUV may be considered to be the first specific substance. This is because when a chemically active species, such as radicals, etc., is generated, it is considered that a change has physically taken place on the surface of the graphene sheet material.

Such chemically active species, such as radicals, etc. is preferably an intrinsically chemically inactive species or a functional group after the species has acted on the graphene sheet material. This implies that the reactivity itself of the bonds is low, or the reactivity is low resultantly because the introduced functional group is bulky as, e.g., tertiary alkyl group.

The first specific substance is not especially limited as long as it is a substance which can generate a chemically active species, such as radicals, etc., by VUV and can be selected out of arbitrary substances. However, it is preferable that the first specific substance has no polar group other than carbon after the reaction processing, and the chemically stable functional group is formed. This is because the functional group formed by the first specific substance is for suppressing the advance of the etching from the edge in etching the graphene sheet material.

More specifically, the first specific substance contains preferably at least one substance selected out of saturated hydrocarbon, aromatic hydrocarbon, alkyl halide, and groups containing mixtures of them. By the use of such substance, generally, the chemical stability of the edge of the graphene sheet material can be improved.

The saturated hydrocarbon includes methane, ethane, propane, n-butane, isobutane, n-pentane, isopentane, neopentane, etc., or their derivative chemical structure substances. The derivative chemical structure substances are the above-described saturated hydrocarbon containing hydroxyl group, carboxyl group, carbonyl group, amino group, quinone group, etc.

The aromatic hydrocarbon includes benzene, toluene, xylene, ethylbenzene and their derivative chemical structure substances. The derivative chemical structure substances include the above-described aromatic hydrocarbon containing hydroxyl group, carboxyl group, carbonyl group, amino group, quinone group, etc.

The alkyl halide includes alkyl fluoride, alkyl chloride, alkyl bromide, alkyl iodide, etc.

The functional group which is generated from the above-described first specific substance and can inactivate the edge of the graphene sheet material includes, e.g., F—, $CF_3$—, $CF_3CF_2$—, $(CF_3)_2CH$—, $(CH_3)_3C$—, $CH_3$—, $CH_3CH_2$—, $(CH_3)_2CH$—, $(CH_3)_3C$—, etc.

The graphene sheet material will be uniformly etched from the surface because the above-described second specific substance is activated by the VUV and generates chemically active species, such as radicals, etc., and the chemical species act on the surface of the graphene sheet material.

The details of its mechanism are not clear but will be, e.g., as follows. That is, the mechanism is that the bonds of the second specific substance floating near the graphene sheet material are cleaved by the irradiated VUV, and active oxygen, such as singlet oxygen, etc., and a chemical species, such as alkoxy radicals, etc. are generated; such radicals, which are unstable and highly reactive, quickly bond with chemically active parts of the surface of the graphene sheet material to etch the graphene sheet material uniformly along the layer surface. At this time, the etching does not advance at the near relatively highly reactive parts on the graphene sheet material (five-membered ring parts, seven-membered ring parts, unstable bonding parts usually called dangling bonds, etc.), i.e., said edge, which are protected by inactive functional groups, and if etched, the rate is extremely low.

Whether it is the second specific substance can be confirmed by the surface of the graphene sheet material been etched in a sense after the irradiation of the VUV, and a change of the layer number of the graphene sheet material being confirmed by AFM, Raman spectroscopy or others.

The second specific substance of the present embodiment is not especially limited and can be selected arbitrarily out of substances which can etch the graphene sheet material. More specifically, preferably, the second specific substance contains at least one substance selected out of oxygen-content substances, e.g., the groups containing oxygen, water, alcohols or their mixtures. These oxygen-content substances generate highly reactive active oxygen. By the use of these oxygen-content substances, generally the graphene sheet material can be etched.

The specific substance is supplied so as to bring the specific substance into contact with the graphene sheet material. This supply is made in the gas phase. When the specific substance is supplied in vapor, because the vapor pressure is low under the normal pressure and at room temperature, or some of the specific substance is not easily vaporized, it is often preferable to use the lower pressure as will be described later or dilute the specific substance with the inactive substance described later so as to accompany the inactive substance or heat the specific substance.

However, it is not essentially necessary that the specific substance is in vapor. For example, the specific substance can be usefully supplied, floating in a spray of another gas. In this case, the floating specific substance contributes to the etching of the graphene sheet material often remaining liquid state.

The ultraviolet rays are classified in UV-A of the wavelength of more than 315 nm and not more than 400 nm, UV-B of the wavelength of more than 280 nm and not more than 315 nm, UV-C of the wavelength of more than 200 nm and not more than 280 nm and VUV of the wavelength of 10 nm-200 nm.

Out of these ultraviolet rays, VUV is used in the method of processing the graphene sheet material according to the present embodiment. This is because the irradiation of the UV rays of this wavelength is sufficient to reform in combination with the first specific substance the edge of the graphene sheet material and for the active species of the second specific substance to cleave the carbon-carbon bonds with the energy of this wavelength. The graphene sheet material generally has high surface stability (chemical stability, etc.) and cannot have the surface sufficiently reformed by the irradiation of UV-A~UV-C or cannot have the surface sufficiently etched or cannot have the surface etched at a sufficient etching rate. The combination of VUV and the above-described specific substances is especially effective in the method of processing the graphene sheet material according to the present embodiment.

The means for obtaining VUV is not especially limited. A Xe excimer UV lamp whose wavelength range is narrow with the central wavelength being 172 nm, or a 193 nm-ArF excimer lamp is preferably exemplified. For 172 nm, a Xe sealed excimer UV lamp whose wavelength distribution of about 160 nm-200 nm is preferable but is not essential. The cleavage energy for the bonding of the organic compounds is related directly with the wavelength of the VUV, and when the etching must be precisely controlled, it is useful to limit the used wavelength range of VUV controlled narrow corresponding to a purpose. For example, when the bonds of low bond energy initially formed at the edge of the graphene sheet material are cleaved, and the edge is modified with the functional groups generated from the first specific substance, it is suitable to use UV rays of a longer wavelength.

The output of the VUV is not limited either, and a lamp of about 10s mW/cm$^2$ output available on the market is preferably usable. However, unless a device which can generate VUV (excimer UV lamp or others) has no problem of cooling and location, the device of higher output can be used, or a plurality of the UV lamps are positioned near each other, whereby the actual radiation quantity per the surface can be increased, which may lead to the productivity improvement.

As indicated by the name, VUV is generally used in vacuum or under reduced pressures. However, in the present embodiment, this is not essential and can be used under the normal pressure. That is, the VUV irradiation in the present embodiment is made to the graphene sheet material positioned in an atmosphere of a reduced pressure or the normal pressure.

The VUV irradiation conditions are decided in consideration that the surface illuminance of the irradiated rays is inversely proportional to the first power of an irradiation distance and that the irradiation intensity attenuates in accordance with the law of Lambert-Beer's law because of the large absorption coefficient of the specific substance. That is, its dilution concentration is decided by making the light source to a sample distance larger when the ray intensity is high and furthermore, in consideration of the degree of the absorption of the specific substance along the distance. Lambert-Beer's law is expressed by $$A = -\log(T) = \log(1/T) = \epsilon bc$$

wherein a transmittance is T; a molar absorption coefficient is $\epsilon$; a medium transmitted length is b; a solution concentration is c; and an absorbance is A.

It is useful in many cases to control the concentration of the specific substance in the atmosphere surrounding the graphene sheet material in that the action of combining the VUV and the specific substance can be controlled and in that practically, the distance between the VUV and the graphene sheet material can be made large. This is because the specific substance, in many cases, has a high absorption coefficient, e.g., the VUV is substantially all absorbed within 1 cm in the air containing oxygen by 20 vol %, and it is preferable in many cases, to lower the concentration (or the vapor pressure or the partial pressure) of the specific substance by some means. This can be attained by adjusting the pressure reduction ratio of the atmosphere, but it is preferable in many cases to use the specific substance diluted with an inactive substance which does not etch the surface of the graphene sheet material even with the VUV irradiated to. Specifically, the specific substance is diluted under the normal pressure to between 0.0005 vol % and 50 vol % and more preferably to between 0.01 vol % and 10 vol %. The inactive substance is not especially limited, but because the environment of the present embodiment is vapor phase, generally, a gaseous substance or a volatile substance is suitable. The inactive gas of neon, argon or others, or nitrogen gas is preferably exemplified. These gases having small absorption coefficients to VUV are suitable to dilute the specific substance.

Preferably, the distance between the graphene sheet material, which is UV rays are to be irradiated to, and the VUV irradiation source is small in many cases because VUV is absorbable. The distance is preferably, e.g., 0.1 mm-1000 mm although depending on the kind and the concentration (or the vapor pressure or the partial pressure) of a substance present between the graphene sheet material and the VUV irradiation source. More preferably, in many cases, about 0.2 mm to 500 mm is preferable.

The method of the VUV irradiation is not especially limited. The VUV irradiation may not be always simultaneous with the supply of the specific substance. The method of continuously supplying the specific substance to the graphene sheet material and continuously making the VUV irradiation, the method of intermittently supplying the specific substance to the graphene sheet material and intermittently making the VUV irradiation in time with the supply of the specific substance, the method of intermittently supplying the specific substance to the graphene sheet material and intermittently making the VUV radiation in time with the supply of the specific substance, setting on the VUV radiation for some time, and other methods are exemplified.

It is not known whether the reformation of the edge of the graphene sheet material and the etching of the graphene sheet material have taken place only at the parts the VUV has been directly irradiated to. When the generated chemically active species, such as radicals, etc., has a long lifetime, the reformation and the etching will take place at parts the VUV has not been directly irradiated to. Accordingly, when the graphene sheet material is generally irradiated with the VUV, and resultantly the reformation and the etching are made, this agrees to the concept of the present embodiment, but generally, it is preferable that the graphene sheet material is so arranged that the VUV is irradiated to the graphene sheet material as directly as possible. For this, the araphene sheet material is positioned on a substrate in parallel therewith.

It is possible to make the above-described processing with parts of the surface of the graphene sheet material covered by the use of the conventional lithography or others to thereby restrict parts for the reformation and the etching to be made. Furthermore, it is also possible to make this operation plural times to make the reformation and the etching by different degrees depending on parts. To restrict parts to be etched, it is preferable to use a hard mask of silicon oxide film, silicon nitride film or others in consideration of the low resistance of the photoresist material to oxygen-content substances.

In the present specification, the "graphene sheet material" means a graphene sheet, or a material of some chemically modified graphene sheet. Graphene sheet is a substance simply called graphene or graphene nanoribbon and typically has a nano-size thickness (e.g., 0.000335 nm-0.002 nm). Graphene sheet is a sheet-shaped, and has a single layer or plural layers of carbon on the apex of each hexagon in the shape of the honeycomb of the honeybees. The graphene sheet may be formed by any method. The most simple method is cleaving araphite, but the graphene sheet can be grown by the same processing, such as CVD method or others, as carbon nanotube.

The graphene sheet material, especially graphene sheet varies the properties depending on its shape but has intrinsic properties in conductivity, semiconductivity, anisotropy in the conductivity and the semiconductivity, etc. The graphene sheet material having too a large layer number approaches the araphite structure and has the anisotropy, which is characteristic of the graphite sheet, reduced. Generally, the graphene sheet having 1 layer to about 5 layers thickness-wise is called graphene sheet in many cases. The length and the width for the thickness are not especially limited but can be suitably selected in accordance with applications and generally are respectively in the range of 0.1 nm-100 nm.

When the graphene sheet material is formed on a substrate by CVD method or others, the material forming the substrate is not especially limited and can be suitably selected out of the known materials. A substrate having conductivity is preferably selected when the conductivity of the graphene sheet material is used, and when the thermal conductivity of the graphene sheet material is used, a substrate having good thermal conductivity is preferably selected. Forming the graphene sheet material on a substrate is not an essential factor of the present embodiment, but when the graphene sheet material has been formed on a substrate, preferably in many cases, it facilitates the direct irradiation of the VUV as described above, and the adhesion to the substrate is good.

The processing apparatus for processing the graphene sheet material of the present embodiment is not especially limited as long as VUV can be apply, and the specific substance can be supplied to the graphene sheet material. For example, the processing apparatus illustrated in FIGS. 1 to 4 can be exemplified.

Figure 2:
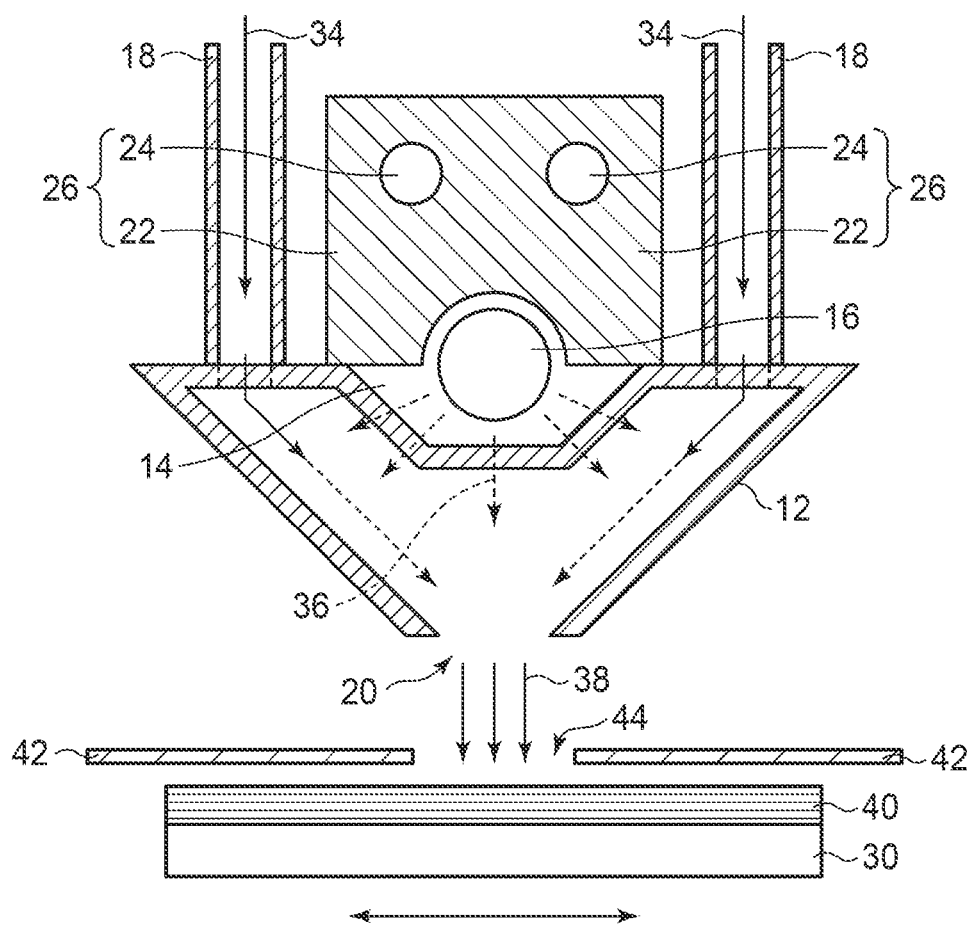
FIG. 2 is a diagrammatic sectional view illustrating a main part of the processing apparatus of a graphene sheet material according to the embodiment.

FIG. 1 is a schematic perspective view illustrating a first example of the processing apparatus of the graphene sheet material according to the present embodiment. FIG. 2 is a sectional view illustrating the main part of the processing apparatus of FIG. 1.

An activation reaction vessel 12 of quart glass is housed in a stainless chamber 10. On the ceiling of the activation reaction vessel 12, an accommodation portion 14 accommodating a Xe excimer UV lamp 16 is provided. In the drawing, both ends of the activation reaction vessel 12 are opened so as to make the inside structure easy to understand, but actually both ends are closed. This is the same with the description below.

As the Xe excimer UV lamp 16, for example, a Xe excimer UV lamp which generates vacuum ultraviolet rays of an emission length along a major axis of 400 nm, a emission central wavelength $\lambda$ of 172 nm, and a light output power of 30 $mW/cm^2$ can be used.

Other than the Xe excimer UV lamp, excimer UV lamps with Kr (krypton), Ar (argon), KrCl (krypton chloride) sealed in (the respective emission central wavelengths are 146 nm, 126 nm and 222 nm) can be also used.

The activation reaction vessel 12 has a plurality of gas feed pipes 18 branched in accordance with a length of the Xe excimer UV lamp 16, and on the underside, a rectangular gas ejection port 20 corresponding to a configuration of the Xe excimer lamp 16. In the drawing, three gas feed pipes are provided on each of the left and right sides of the accommodation portion 14.

The Xe excimer UV lamp 16 has a cooling mechanism 26 formed of a metal block 22 having coolant ducts 24 and is fixedly retained on the accommodation portion 14 via the metal block 22. As the coolant, for example, a gaseous refrigerant substance can be used.

In the chamber 10, a substrate mounting stage 28 which is movable in the X-Y direction is provided. The substrate mounting stage 28 has a temperature adjuster (not illustrated) for controlling the temperature of a substrate-to-be-processed 30 incorporated and a motion mechanism 22 for moving the substrate-to-be-processed 30 in the X-Y direction.

Next, the operation of the processing apparatus illustrated in FIGS. 1 and 2 will be described.

A substrate-to-be-processed 30 with a graphene sheet material 40 formed on the surface is mounted on the substrate mounting stage 28 and kept at a prescribed processing temperature by a temperature adjuster not illustrated.

In this state, through the gas feed pipes 18, a mixed gas 34 of the first or the second specific substance diluted with an inactive gas or a gaseous substance inactive to VUV, such as $N_2$ or others, is fed. Simultaneously, the Xe excimer UV lamp 16 is turned on, VUV rays 36 of a 172 nm-wavelength are generated, and the first or the second specific substance is activated with the VUV rays 36.

The active species 38 generated by activating the first specific substance is jetted to the substrate-to-be-process 30 through the gas ejection port 20. Thus, the active species 38 acts on the graphene sheet material 40 formed on the surface of the substrate-to-be-processed 30 to inactivate the edge of the graphene sheet material 40.

Otherwise, the active species 38, such as $^1\Delta_g O_2^*$, etc. generated by activating the second specific substance is jetted onto the substrate-to-be-processed 30 through the gas ejection port 20. Thus, the active species 38 acts on the graphene sheet material 40 formed on the surface of the substrate-tobe-processed 30, and the graphene sheet material 50 is etched. At this time, the etching advances one by one sequentially from the layer on the surface.

The activation reaction vessel 12 is provided, the active species 38 is generated in advance in the activation reaction vessel 12, and the generated active species 38 is jetted onto the substrate-to-be-processed 30, whereby the substrate-to-be-processed 30 can be located without considering the absorption distance of the VUV rays 36. This drastically increases the design freedom and simplifies the apparatus constitution.

As the reaction gas, the mixed gas 34 of the specific substance diluted with a gas or a gaseous substance, such as $N_2$ or others, inactive to VUV is used, whereby the light absorption distance can be made longer, which can improve the activation efficiency by the light absorption can be improved. This allows the configuration of the activation reaction vessel 12 to be larger, which can increase the design freedom.

When the surface of the substrate-to-be-processed 30 cannot be uniformly processed at once in, e.g., the case that the substrate-to-be-processes 30 is unignorably large for the gas ejection port 20 or in other cases, the processing is made with the substrate mounting stage 20 being moved. For example, when the substrate-to-be-processed 30 is smaller than the emission length of the Xe excimer UV lamp 16, the processing is made with the substrate mounting stage 28 being scanned in the direction normal to the major axial direction of the gas ejection port 20 (x direction). When the y direction-wise length of the substrate-to-be-processed 30 is larger than the emission length of the Xe excimer UV lamp 16, the processing is made with the substrate mounting stage 28 being scanned also in the y direction. Thus, the processing can be made uniformly over the entire surface of the substrate-to-be-processed 30. The scan of the substrate mounting stage 28 may be made continuously at a constant motion rate or with a move and a pause intermittently repeated.

At this time, it is useful to prepare the data base relating processing parameters relating to the etching rate of the graphene sheet material 40, such as the VUV intensity, the specific substance concentration, the distance between the gas ejection port 20 and the substrate-to-be-processed 30, etc., and the motion rate of the substrate mounting stage 28, and provide a control mechanism for controlling the substrate mounting stage 28, based on the data base. For example, it is considered that the motion rate of the substrate mounting stage 28 is set, based on the relationship with the etching rate of the graphene sheet material 40 so that 1 layer of the graphene sheet is uniformly removed by once scan.

It is also effective to provide a shield plate 42 having a slit 44 as illustrated in FIG. 2 between the gas ejection port 20 and the substrate-to-be-processed 30. The slit 44 is formed in e.g., the region where the substrate-to-be-processed 30 can be uniformly processed without being moved. This makes the processing more uniform.

Figure 3:
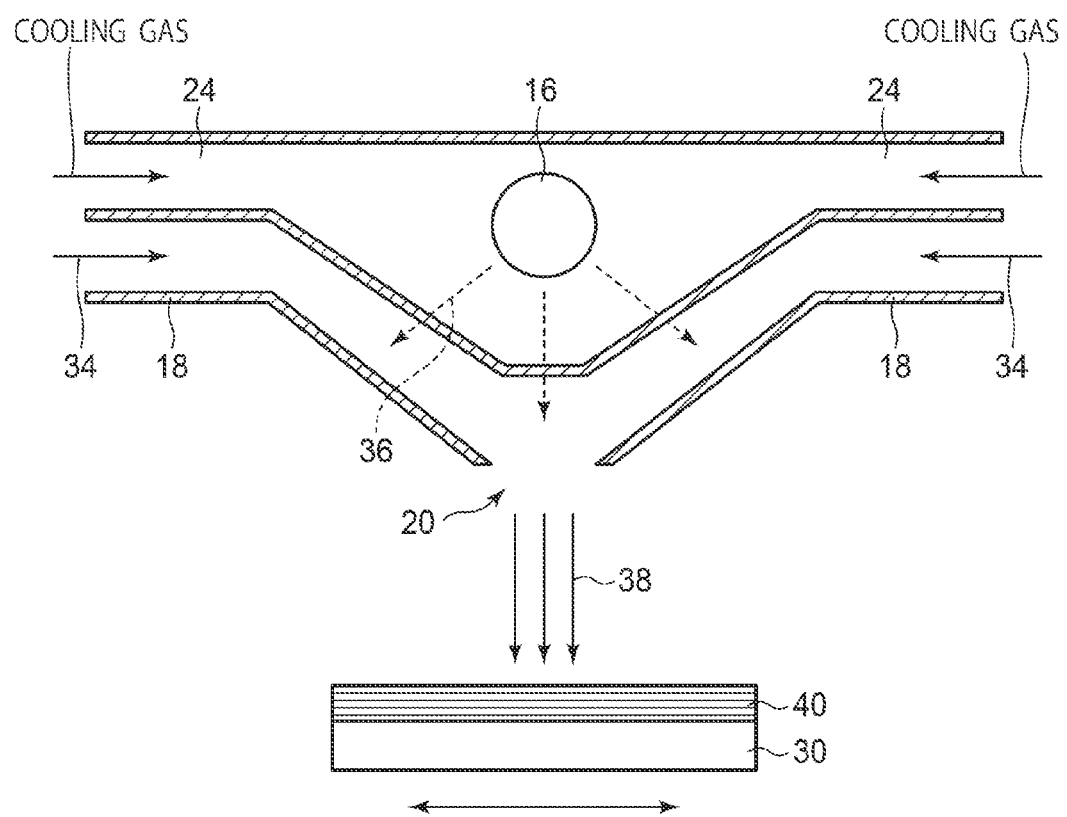
FIG. 3 is a diagrammatic sectional view illustrating a processing apparatus of a graphene sheet material according to another example of the embodiment.

FIG. 3 is a diagrammatic sectional view illustrating a second example of the processing apparatus of the graphene sheet material according to the present embodiment. FIG. 3 illustrates the main part of the processing apparatus, and the rest constitutional part is the same as that of the first example illustrated in FIG. 1. The processing apparatus is the same as the processing apparatus illustrated in FIGS. 1 and 2 except that the gas feed pipes 18 of the activation reaction vessel 12 and the coolant ducts 24 of the Xe excimer UV lamp 16 are so formed that the feed is made from the sides.

Figure 4:
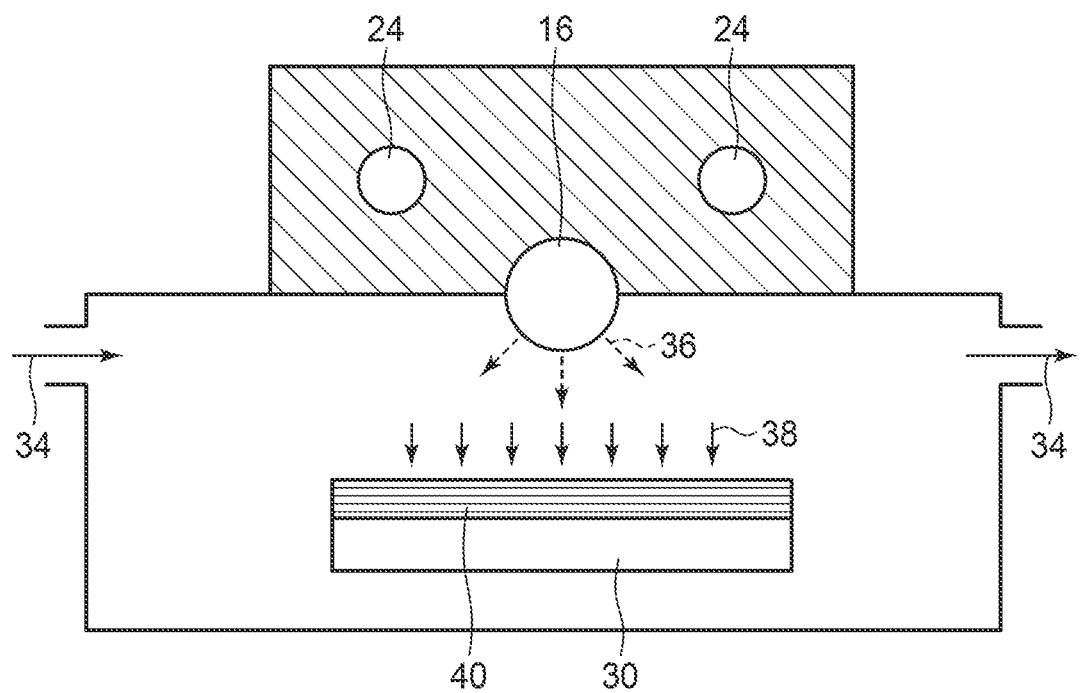
FIG. 4 is a diagrammatic sectional view illustrating a processing apparatus of a graphene sheet material according to further another example of the embodiment.

FIG. 4 is a diagrammatic sectional view illustrating a third example of the processing apparatus of the graphene sheet material according to the present embodiment. FIG. 4 illustrates the main part of the processing apparatus, and the rest constitutional part is the same as that of the first example illustrated in FIG. 1. In the processing apparatus illustrated in FIG. 4, the coolant ducts are replaced by water cooling ducts, and the substrate-to-be-processed 30 is moved in the supply passage of the mixed gas 34.

Next, specific proceedings of the method of processing the graphene sheet material according to the present embodiment will be described with reference to FIGS. 5A-5D.

FIGS. 5A-5D are sectional views illustrating the method of processing the graphene sheet material according to the present embodiment.

Figure 5A:
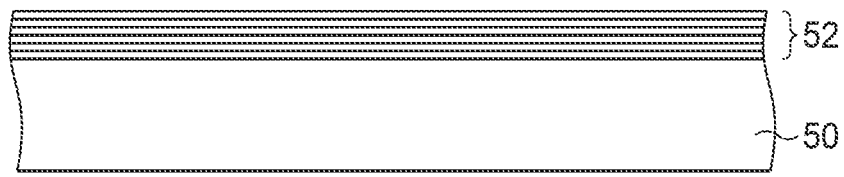
FIGS. 5A-5D are sectional views illustrating a method of processing a graphene sheet material according to the embodiment.

First, a graphene sheet material layer 52 is formed above a substrate 50 (FIG. 5A). The substrate 50 is not especially limited, and various substrates, which the graphene sheets can be grown on, such as silicon wafers etc., may be used. As the substrate 50, a p-type (100)-oriented silicon wafer, for example, is used here.

The method for forming the graphene sheet material layer 52 is not especially limited, and various methods, such as the method of transferring a graphene sheet material layer from a graphite bulk with an adhesive member, such as an adhesive tape or others, methods using a film forming apparatus, such as CVD method, etc., and others can be used. The number of the layers contained in the graphene sheet material layer 52 can be any. The graphene sheet material layer 52 is formed here by, e.g., CVD method, with, e.g., acetylene gas as the raw material and at, e.g., 1000° C.

Next, the layer number of the graphene sheets contained in the graphene sheet material layer 52 formed above the substrate 50 is measured. To measure the layer number of the graphene sheets, AFM (Atomic Force Microscope) or Raman spectroscopy can be used.

In the measurement with AFM, the layer number of the graphene sheet material layer 52 can be computed by measuring the film thickness of the graphene sheet material layer 52. The film thickness of one layer of the graphene sheet is about 0.335 nm. Accordingly, the layer number contained in the graphene sheet can be computed by measuring the film thickness of the graphene sheet material layer 52.

For example, in the measurement with AFM, if the film thickness of the graphene sheet material layer 52 is 6.7 nm, it is seen that the graphene sheet material layer 52 has 20 layers of graphene sheets.

In the measurement by Raman microscopy, the Raman shift varies depending on the layer number of the graphene sheet. For example, the layer number of the graphene sheet can be measured by checking the peak position of a D2 band near 2700 $cm^{-1}$ of the measured Raman shift.

Figure 5B:

Then, as required, the graphene sheet material layer 52 is patterned by, e.g., photolithography and dry etching (FIG. 5B).

Then, the substrate 50 with the graphene sheet material layer 52 formed on is baked for 5 minutes at, e.g., 300° C. to remove burnable impurities other than the graphene sheet on the surface of the graphene sheet material layer 52.

Next, the substrate 50 with the patterned graphene sheet material layer 52 formed on is loaded into the processing apparatus according to the present embodiment as illustrated in FIGS. 1 to 4. The above described measurement of the layer number of the graphene sheets contained in the graphene sheet material layer 52 may be made at any stage before the graphene sheet material is loaded in the processing apparatus.

Next, by the same proceedings described with reference to FIG. 2, the processing for reforming the edge of the graphene sheet material layer 52 is made.

As the conditions for processing the graphene sheet material layer 52, the intensity of the VUV is set at, e.g., 1 mW/cm$^2$-200 mW/cm$^2$, preferably 5 mW/cm$^2$-50 mw/cm$^2$; the concentration of the first specific substance of the mixed gas is set at, e.g., 0.01 vol %-50 vol %, preferably, 0.01 vol %-10 vol %; the distance between the gas ejection port 20 and the substrate-to-be-processed 30 is set at, e.g., 0.1 mm-100 mm, preferably, 0.2 mm-tens mm; the motion rate of the substrate mounting stage is set at, e.g., 0.1 mm/second-1000 mm/second, preferably 1 mm/second-300 nm/second.

For example, the mixed gas 34 prepared by diluting and mixing ethane (CH$_3$CH$_2$) as the first specific substance with pure nitrogen to have the vapor pressure of an about 5 vol % concentration at 1 atmospheric pressure is used and is jetted onto the graphene sheet material layer 52 at the flow rate of 1 L per minute of the mixed gas. Then, immediately after the supply of the mixed gas 34 has been started, an excimer UV lamp of 172 nm emission central wavelength λ and 400 mm emission length irradiates for 3 minutes at a 30 mW/cm$^2$ output and at a 1 cm-distance from the sample.

Otherwise, as the first specific substance, the mixed gas 34 prepared by diluting and mixing methane (CH$_4$) with pure nitrogen to have the vapor pressure of an about 2 vol % concentration at 1 atmospheric pressure is used and is jetted onto the graphene sheet material layer 52 at the flow rate of 2 L per minute of the mixed gas. Next, immediately after the supply of the mixed gas 34 has been started, an excimer UV lamp of 172 nm emission central wavelength λ and 400 mm emission length irradiates for 3 minutes at a 30 mW/cm$^2$ output and at a 1 cm-distance from the sample (the first condition).

Figure 5C:
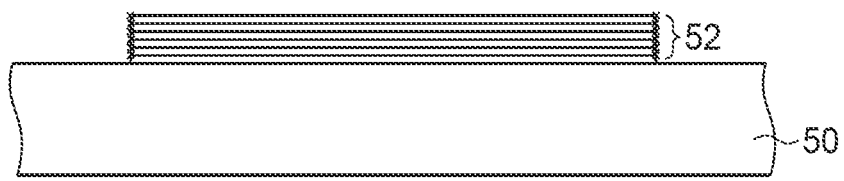

Thus, the active species 38 acts on the edge of the graphene sheet material layer 52, and the edge of the graphene sheet material layer 52 is inactivated (FIG. 5C). In the drawing, the inactivated edge is indicated by the × marks.

Whether the edge of the graphene sheet material layer 52 has been inactivated can be confirmed by XPS (X-ray Photoelectron Spectroscopy) method and IR (Infrared absorption) spectra. The edge of the graphene sheet material layer 52 before processed is terminated with C=O bonds, C—O bonds, etc. Accordingly, when the C=O bonds and the C—O bonds are confirmed to have decreased or to be absent by the measurement after the reformation processing, and bonds, such as C—C bonds, etc., expressing the functional group formed by the first specific substance have been increased, the edge is considered to have been inactivated.

Next, by the same proceedings described in FIG. 2, the graphene sheet material layer 52 is etched.

At this time, the processing period of time is suitably controlled in accordance with the processing conditions, whereby a prescribed number of graphene sheets are etched from the surface of the graphene sheet material layer 52.

With the edge of the graphene sheet material layer 52 inactivated by the processing using the first specific substance, the etching of the graphene sheet material layer 52 advances, pealing the layers one by one. At this time, the processing period of time is suitably controlled in consideration of an etching rate of the graphene sheet measured in advance, whereby an arbitrary number of layers of the graphene sheet can be etched.

Thus, the graphene sheet material layer 52 including the prescribed number of graphene sheets can be left by setting the processing time in consideration of the layer number of the graphene sheets measured in advance.

As the processing conditions for the graphene sheet material layer 52, the intensity of the VUV is set at, e.g., 1 mW/cm$^2$-200 mW/cm$^2$, preferably 5 mW/cm$^2$-50 mW/cm$^2$; the concentration of the second specific substance in the mixed gas is set at, e.g., 0.0005 vol %-20 vol %, preferably, 0.01 vol %-5 vol %; the distance between the gas ejection port 20 and the substrate-to-be-processed 30 is set at, e.g., 0.1 mm-1000 mm, preferably, 1 mm-500 mm; the motion rate of the substrate mounting stage 28 is set at, e.g., 0.1 mm/second-100 mm/second, preferably, 1 mm/second-300 mm/second.

For example, the mixed gas 34 prepared by diluting and mixing oxygen gas as the second specific substance with pure nitrogen to have the vapor pressure of about 0.5 vol % concentration at 1 atmospheric pressure is used and is jetted onto the graphene sheet material layer 52 at the flow rate of 1 L per minute. Then, immediately after the supply of the mixed gas 34 has been started, an excimer UV lamp of 172 nm emission central wavelength λ and a 400 mm emission wavelength irradiates at a 30 mW/cm$^2$ output and at 10 cm distance from the sample. The etching rate of the graphene sheet at this time is about 0.023 nm/second. Accordingly, the processing of, e.g., about 15 seconds is made under these conditions, whereby 1 layer of the graphene sheet can be removed.

Otherwise, the mixed gas 34 prepared by diluting and mixing oxygen gas as the second specific substance with pure nitrogen to have the vapor pressure of about 0.5 vol % concentration at 1 atmospheric pressure is used and is jetted onto the graphene sheet material layer 52 at the flow rate of 5 L per minute. Then, immediately after the supply of the mixed gas 34 has been started, an excimer UV lamp of 172 nm emission central wavelength and 400 mm emission wavelength radiates at 30 mW/cm$^2$ and at 30 cm distance from the sample. The etching rate of the graphene sheet at this time is about 0.0014 nm/second. Accordingly, the processing of, e.g., about 250 seconds under these conditions is made, whereby 1 layer of the graphene sheet can be removed.

Otherwise, the mixed gas 34 prepared by diluting and mixing oxygen gas as the second specific substance with pure nitrogen to have the vapor pressure of about 0.1 vol % concentration at 1 atmospheric pressure is used and is jetted onto the graphene sheet material layer 52 at the flow rate of 5 L per minute. Then, immediately after the supply of the mixed gas 34 has been started, an excimer UV lamp of 172 nm emission central wavelength A and 400 mm emission wavelength radiates at 20 mW/cm$^2$ and at 30 cm distance from the sample. The etching rate at this time is about 0.03 nm/second. Accordingly, by the processing of, e.g., 10 second under these conditions, 1 layer of the graphene sheet can be removed (the second condition).

The etched layer number of the graphene sheet material layer 52 can be known by the measurement of microscopic Raman spectra. For example, the peak position of the D2 band near 2700 cm$^{-1}$ is shifted toward the short wavelength side by about 30 cm$^{-1}$, based on which it is known that 1 layer of the graphene sheet has been etched.

The effect of the inactivation of the edge of the graphene sheet material layer 52 can be known by the shape observation with AMF, etc. That is, the upper surface shape of the graphene sheet material layer 52 has made no change from a shape before etched, based on which it can be confirmed that the etching from the edge of the graphene sheet material layer 52 is suppressed.

Figure 5D:

Thus, the graphene sheet material layer 52 having a prescribed layer number of the graphene sheet is formed (FIG. 5D).

The graphene sheet material of a prescribed layer number formed by the method of processing the graphene sheet material according to the present embodiment can be used as required in any application, such as electric products, electronic products, mechanical products, etc., in which the graphene sheet material is used or is usable and, in consideration of the superior electric properties and thermal properties of the graphene sheet material, is usable more suitably in electronic devices (e.g., semiconductor devices, and semiconductor integrated circuit devices including the semiconductor devices). Such electronic members can be interconnections and vias of electronic devices, etc., gate electrodes, source electrodes, drain electrodes, channels, etc. of transistors.

As described above, according to the present embodiment, the etching from the edge of the graphene sheet material can be suppressed, and each graphene sheet can be removed one by one from the surface layer of the graphene sheet material. Thus, a graphene sheet material having a prescribed layer number of the graphene sheet can be easily formed.

The above-described embodiment can cover other various modifications.

For example, in the above-described embodiment, the processing of removing graphene sheets sequentially from the surface of the graphene sheet material, but it is not essential that graphene sheets are removed uniformly in plane. For example, it is empirically recognized that the most surface graphene sheet is partially removed, whereby the same electric characteristics as those given by uniformly removing the most surface graphene sheet. Accordingly, from the viewpoint of, e.g., forming the graphene sheet material of prescribed electric properties, it is not essential to remove the graphene sheets uniformly in plane.

The conditions for processing the graphene sheet material described in the embodiment described above are optimum examples for the apparatus used by the inventor of the present application and are not limited to them. The optimum values of the processing conditions vary depending on apparatus to be used and changes of compositions of objects to be etched and preferably, are suitably set.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A method of processing a graphene sheet material comprising:
    irradiating UV ray to a graphene sheet material in a first atmosphere containing a first substance to activate the first substance and inactivate an edge of the graphene sheet material by the activated first substance; and
    irradiating UV ray to a surface of the graphene sheet material in a second atmosphere containing a second substance containing oxygen to activate the second substance, and oxidize and remove a graphene sheet contained in the graphene sheet material sequentially from a surface side.

2. The method of processing a graphene sheet material according to claim 1, further comprising:
    measuring a layer number of the graphene sheet contained in the graphene sheet material, wherein
    in removing the graphene sheet, the graphene sheet is so removed that a prescribed layer number of the graphene sheet remains.

3. The method of processing a graphene sheet material according to claim 1, wherein in inactivating the edge of the graphene sheet material, an end group bonded to the edge of the graphene sheet material is substituted with more stable functional group produced from the first substance to thereby inactivate the edge of the graphene sheet material.

4. The method of processing a graphene sheet material according to claim 3, wherein
    in removing the graphene sheet, the edge of the graphene sheet material is protected by the functional group from the activated second substance.

5. The method of processing a graphene sheet material according to claim 3, wherein
    the functional group is F—, $CF_3$—, $CF_3CF_2$—, $(CF_3)_2CH$—, $(CH_3)_3C$—, $CH_3$—, $CH_3CH_2$—, $(CH_3)_2CH$—, or $(CH_3)_3C$—.

6. The method of processing a graphene sheet material according to claim 1, wherein
    the first substance contains at least one substance selected from the group consisting of saturated hydrocarbon, aromatic hydrocarbon, alkyl halide and groups containing their mixtures.

7. The method of processing a graphene sheet material according to claim 1, wherein
    the first atmosphere contains the first substance diluted with an inactive gas.

8. The method of processing a graphene sheet material according to claim 1, wherein
    the UV ray is a vacuum UV ray.

9. The method of processing a graphene sheet material according to claim 8, wherein
    the vacuum UV ray is generated by a vacuum UV lamp using at least one kind of material selected from the group consisting of xenon, krypton, argon or krypton chloride.

10. The method of processing a graphene sheet material according to claim 1, wherein
    the graphene sheet material is a laminate of graphene sheets or partially chemically modified graphene sheets.

11. A method of manufacturing an electronic device comprising:
    irradiating UV ray to a graphene sheet material in a first atmosphere containing a first substance to activate the first substance and inactivate an edge of the graphene sheet material by the activated first substance; and
    irradiating UV ray to a surface of the graphene sheet material in a second atmosphere containing a second substance containing oxygen to activate the second substance, and oxidize and remove a graphene sheet contained in the graphene sheet material sequentially from a surface side.

12. The method of manufacturing an electronic device according to claim 11, further comprising:
    measuring a layer number of the graphene sheet contained in the graphene sheet material, wherein
    in removing the graphene sheet, the graphene sheet is so removed that a prescribed layer number of the graphene sheet remains.

13. The method of manufacturing an electronic device according to claim 11, wherein
    in inactivating the edge of the graphene sheet material, an end group bonded to the edge of the graphene sheet material is substituted with more stable functional group produced from the first substance to thereby inactivate the edge of the graphene sheet material.

14. The method of manufacturing an electronic device according to claim 13, wherein the functional group is F—, $CF_3$—, $CF_3CF_2$—, $(CF_3)_2CH$—, $(CH_3)_3C$—, $CH_3$—, $CH_3CH_2$—, $(CH_3)_2CH$—, or $(CH_3)_3C$—.

15. The method of manufacturing an electronic device according to claim 13, wherein the first substance contains at least one substance selected from the group consisting of saturated hydrocarbon, aromatic hydrocarbon, alkyl halide and groups containing their mixtures.

16. The method of manufacturing an electronic device according to claim 11, wherein the first atmosphere contains the first substance diluted with an inactive gas.

17. The method of manufacturing an electronic device according to claim 11, wherein the UV ray is a vacuum UV ray.

18. The method of manufacturing an electronic device according to claim 11, wherein the vacuum UV ray is generated by a vacuum UV lamp using at least one kind of material selected from the group consisting of xenon, krypton, argon or krypton chloride.

\* \* \* \* \*

UNITED STATES PATENT AND TRADEMARK OFFICE
CERTIFICATE OF CORRECTION

PATENT NO. : 8,465,661 B2
APPLICATION NO. : 13/228785
DATED : June 18, 2013
INVENTOR(S) : Koji Asano It is certified that error appears in the above-identified patent and that said Letters Patent is hereby corrected as shown below:

Title Page, Item (73):
Change

(73)　　Assignee:　　Fujtsu Limited, Kawasaki (JP)

To be

(73)　　Assignee:　　Fujitsu Limited, Kawasaki (JP)

Signed and Sealed this
Twenty-seventh Day of August, 2013

Teresa Stanek Rea
*Acting Director of the United States Patent and Trademark Office*